United States Patent
Heubi et al.

(10) Patent No.: US 12,401,327 B2
(45) Date of Patent: Aug. 26, 2025

(54) LOW-NOISE AMPLIFIER (LNA) WITH HIGH POWER SUPPLY REJECTION RATIO (PSRR)

(71) Applicant: SEMICONDUCTOR COMPONENTS INDUSTRIES, LLC, Phoenix, AZ (US)

(72) Inventors: Alexander Heubi, La Chaux-de-Fonds (CH); Onur Kazanc, Boudry (CH)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 609 days.

(21) Appl. No.: 17/663,483

(22) Filed: May 16, 2022

(65) Prior Publication Data

US 2023/0055295 A1 Feb. 23, 2023

Related U.S. Application Data

(60) Provisional application No. 63/260,464, filed on Aug. 20, 2021.

(51) Int. Cl.
*H03F 3/193* (2006.01)
*H03F 1/30* (2006.01)

(52) U.S. Cl.
CPC .............. *H03F 3/193* (2013.01); *H03F 1/301* (2013.01); *H03F 2200/171* (2013.01); *H03F 2200/294* (2013.01); *H03F 2200/451* (2013.01)

(58) Field of Classification Search
CPC .............. H03F 3/193; H03F 2200/451; H03F 2200/171; H03F 2200/294; H03F 1/301

USPC .......................................................... 330/296
See application file for complete search history.

(56) References Cited

U.S. PATENT DOCUMENTS

| | | | |
|---|---|---|---|
| 2004/0085130 A1 | 5/2004 | Lou | |
| 2005/0270098 A1 | 12/2005 | Zhang et al. | |
| 2012/0302186 A1* | 11/2012 | Jones | ..................... H03F 1/0227 455/127.1 |
| 2015/0318829 A1* | 11/2015 | Astgimath | .............. H03F 3/505 330/291 |

(Continued)

FOREIGN PATENT DOCUMENTS

| | | | |
|---|---|---|---|
| CN | 206226389 U | * | 6/2017 |
| EP | 0358266 B1 | | 4/1996 |

(Continued)

*Primary Examiner* — Andrea Lindgren Baltzell
*Assistant Examiner* — Lance Torbjorn Bartol
(74) *Attorney, Agent, or Firm* — Polansky & Associates, P.L.L.C.; Paul J. Polansky

(57) ABSTRACT

A low-noise amplifier includes a low-noise amplifier stage and a filtering and biasing stage. The low-noise amplifier stage receives an input signal and provides a first output signal in response thereto. The low-noise amplifier stage includes a gain element for proving the first output signal, and at least one lowpass filter circuit in series between a first power supply voltage terminal and the gain element having a conductivity determined by lowpass filtering a signal at a bias terminal, and a filtering and biasing stage having an input for receiving the first output signal, and an output for providing a second output signal, and at least one cascode element having a first current conduction path coupled in series between the bias terminal and the output, and having a predetermined filter characteristic.

20 Claims, 2 Drawing Sheets

(56) References Cited

U.S. PATENT DOCUMENTS

2016/0056778 A1* 2/2016 Blum .................... H03F 1/0272
                                                                 330/296
2018/0331664 A1* 11/2018 Yoshioka .................. H03F 1/56

FOREIGN PATENT DOCUMENTS

TW          201110540 A  *  3/2011            H03F 1/223
WO    WO-2019209728 A2 *  10/2019            H03F 3/19

* cited by examiner

LOW-NOISE AMPLIFIER (LNA) WITH HIGH POWER SUPPLY REJECTION RATIO (PSRR)

This application claims the benefit of U.S. Provisional Patent Application No. 63/260,464, filed on Aug. 20, 2021, the entire contents of which are incorporated herein by reference.

FIELD OF THE DISCLOSURE

This disclosure relates generally to amplifier circuits, and more specifically to low noise amplifiers for use in applications such as wireless communication systems.

BACKGROUND

A low-noise amplifier (LNA) is an electronic amplifier that amplifies a very low-power signal without significantly degrading its signal-to-noise ratio. Low-noise amplifiers (LNA) are common blocks in wireless communication systems, such as near-field magnetic induction (NFMI) receivers, radio frequency (RF) receivers, etc. For lowest noise and highest energy efficiency, a single-ended implementation is generally preferred.

The performance of LNA is dependent not only on the design of the amplifier itself, but often also by external factors such as power supply noise, especially for single-ended designs. While very high frequency power supply noise in the giga-Hertz (GHz) range can be relatively easily filtered by passive devices, it becomes more difficult to filter out power supply noise in lower frequency ranges, such as in the mega-Hertz (MHz) range. As a result, it has been difficult to exploit the low-noise and high-efficiency capabilities of single-ended LNAs, and fully-differential LNAs are often used instead.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
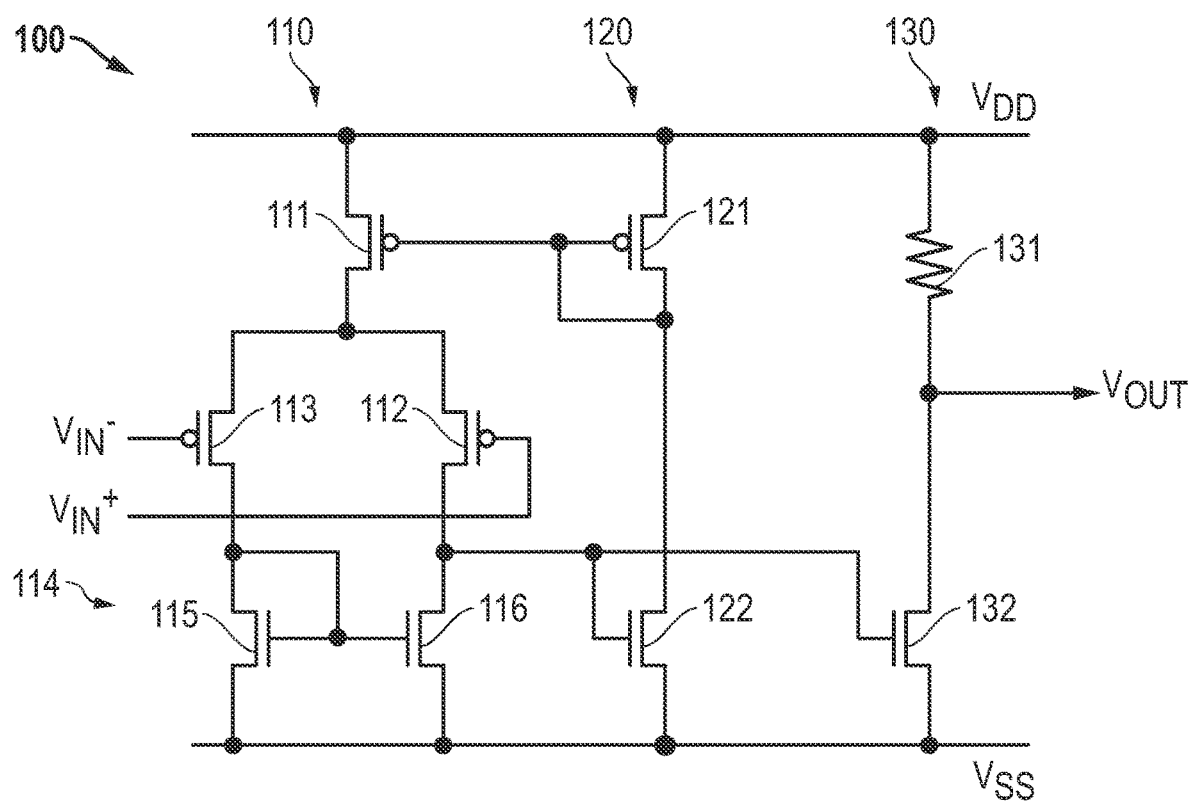
FIG. 1 illustrates in schematic form a conventional low noise amplifier (LNA) known in the prior art.

FIG. 1 illustrates in schematic form a conventional low noise amplifier (LNA) 100 known in the prior art. LNA 100 includes generally an input stage 110, a biasing stage 120, and an output stage 130.

Input stage 110 includes generally transistors 111-113 and a current mirror 114. Transistor 111 is a P-channel metal-oxide-semiconductor (MOS) transistor having a source connected to a power supply voltage terminal labelled "$V_{DD}$", a gate, and a drain. $V_{DD}$ is a more-positive power supply voltage terminal having a nominal voltage of, for example, 3.0 volts. Transistor 112 is a P-channel MOS transistor having a source connected to the drain of transistor 111, a gate for receiving an input signal labelled "$V_{IN+}$", and a drain providing an output of input stage 110. Transistor 113 is a P-channel MOS transistor having a source connected to the drain of transistor 111, a gate for receiving an input signal labelled "$V_{IN-}$", and a drain. Current mirror 114 includes transistors 115 and 116. Transistor 115 is an N-channel MOS transistor having a drain connected to the drain of transistor 113, a gate connected to the drain thereof, and a source connected to a power supply voltage terminal labelled "$V_{SS}$". $V_{SS}$ is a more-negative or ground power supply voltage terminal having a nominal voltage of 0.0 volts. Transistor 116 is an N-channel MOS transistor having a drain connected to the drain of transistor 112, a gate connected to the drain of transistor 115, and a source connected to $V_{SS}$.

Biasing stage 120 includes transistors 121 and 122. Transistor 121 is a P-channel MOS transistor having a source connected to $V_{DD}$, a gate connected to the gate of transistor 111, and a drain connected to the gate thereof. Transistor 122 is an N-channel MOS transistor having a drain connected to the drain of transistor 121, a gate connected to the drain of transistor 112, and a source connected to $V_{SS}$.

Output stage 130 includes a resistor 131, and a transistor 132. Resistor 131 has a first terminal connected to $V_{DD}$, and a second terminal providing an output of LNA 100 labelled "$V_{OUT}$". Transistor 132 is an N-channel MOS transistor having a drain connected to the second terminal of resistor 131, a gate connected to the drain of transistor 112, and a source connected to $V_{SS}$.

In operation, transistor 111 generates a bias current for input stage 110, and transistors 112 and 113 divert the bias current based on the difference between voltages VIN+ and VIN−, which changes the voltage on the drain of transistor 112 in response thereto. Current mirror 114 mirrors the current flowing through transistor 113 to the drain-to-source current of transistor 116 based on the gate width-to-gate length ratio of transistors 115 to 116. This current is in turn mirrored by a current mirror formed by transistors 121 and 111 to form the source-to-drain current of transistor 111 based on the gate width-to-gate length ratio of transistors 121 to 111. When the currents balance, the voltage on the drain of transistor 112 is proportional to the difference in voltage between $V_{IN+}$ and $V_{IN-}$. The voltage controls the conductivity of transistor 132 such that the drain-to-source current of transistor 132 varies linearly with small-signal changes between $V_{IN+}$ and $V_{IN-}$. These linear changes affect the current-resistance (IR) drop across resistor 131, and thus $V_{OUT}$ varies proportionately to the difference between $V_{IN+}$ and $V_{IN-}$.

LNA 100 is a typical differential input operational amplifier having a self-current biasing structure, and many other known LNAs are built on the basic structure of LNA 100. Even with the differential input structure, its PSRR is limited to about 40 dB. An LNA architecture that provides better PSRR would be desirable.

Figure 2:
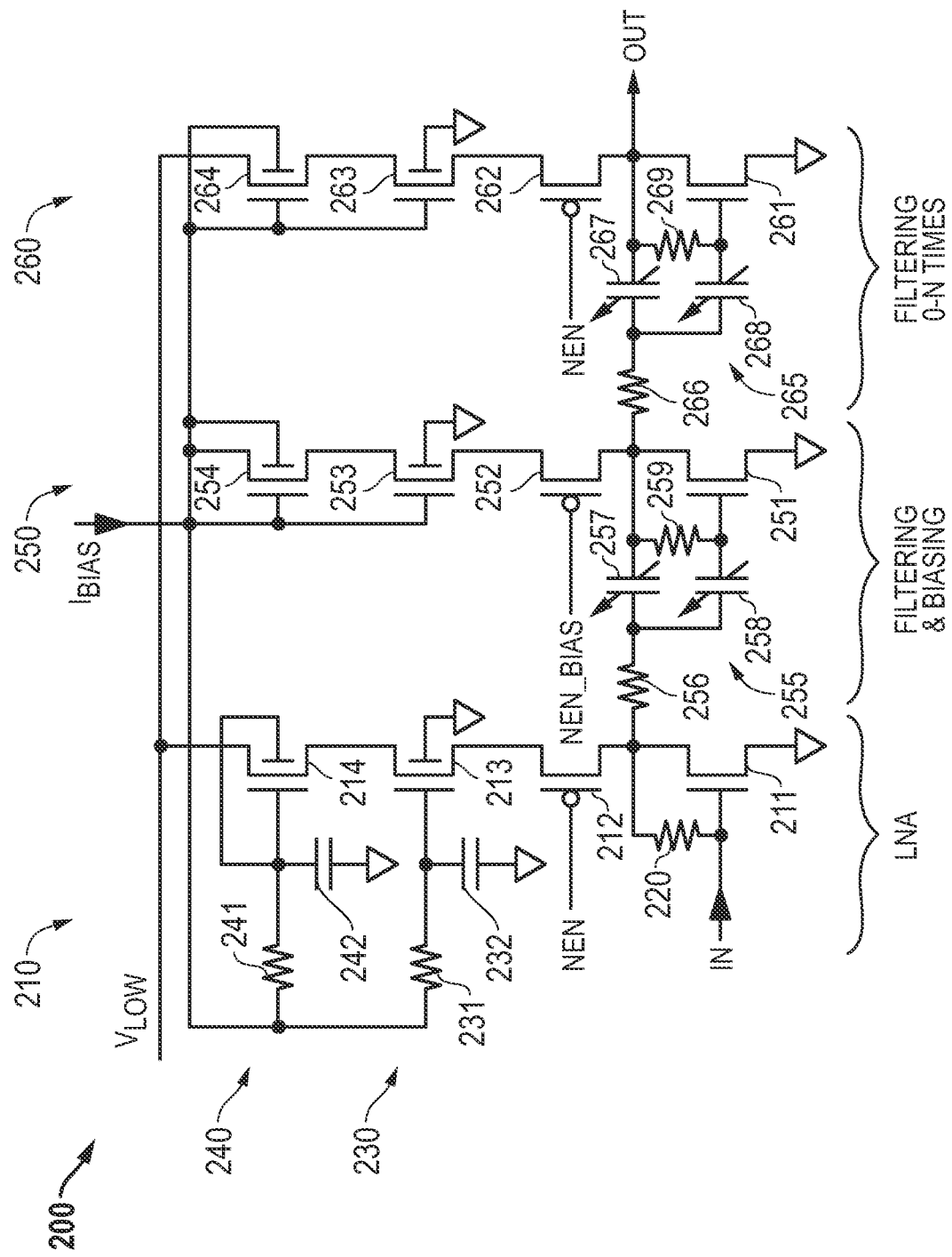
FIG. 2 illustrates in schematic form a low noise amplifier (LNA) with a high power-supply rejection ratio (PSRR) according to various embodiments of the present disclosure.

FIG. 2 illustrates in schematic form a low noise amplifier (LNA) 200 with a high PSRR according to various embodiments of the present disclosure. LNA 200 includes generally a low-noise amplifier stage 210, a filtering and biasing stage 250, and one or more optional filtering stages 260.

Low-noise amplifier stage 210 includes transistors 211-214, a resistor 220, a lowpass filter circuit 230, and a lowpass filter circuit 240. Transistor 211 is an N-channel MOS transistor having a drain, a gate for receiving an input signal labelled "IN", and a source connected to ground. Transistor 212 is a P-channel MOS transistor having a source, a gate for receiving a control signal labelled "NEN", and a drain connected to the drain of transistor 211. Transistor 213 is an N-channel MOS transistor having a drain, a gate, a source connected to the source of transistor 212, and a bulk terminal connected to ground. Transistor 214 is an N-channel MOS transistor having a drain for receiving a power supply voltage labelled "VLOW", a gate, a source connected to the drain of transistor 213, and a bulk terminal connected to the gate thereof. Resistor 220 has a first terminal connected to the drain of transistor 211, and a second terminal connected to the gate of transistor 211. Lowpass filter 230 includes a resistor 231, and a capacitor 232. Resistor 231 has a first terminal connected to the bias node, and a second terminal connected to the gate of transistor 213. Capacitor 232 has a first terminal connected to the second terminal of resistor 231 and to the gate of transistor 213, and a second terminal connected to ground. Lowpass filter 240 includes a resistor 241, and a capacitor 242. Resistor 241 has a first terminal connected to the bias node, and a second terminal connected to the gate of transistor 214. Capacitor 242 has a first terminal connected to the second terminal of resistor 241 and to the gate of transistor 214, and a second terminal connected to ground.

Filtering and biasing stage 250 includes transistors 251-254 and a bandpass network 255. Transistor 251 is an N-channel MOS transistor having a drain, a gate, and a source connected to ground. Transistor 252 is a P-channel MOS transistor having a source, a gate for receiving a control signal labelled "NEN_BIAS", and a drain connected to the drain of transistor 251. Transistor 253 is an N-channel MOS transistor having a drain, a gate, and a source connected to the source of transistor 252, and a bulk terminal connected to ground. Transistor 254 is an N-channel MOS transistor having a drain for receiving a power supply voltage labelled "VLOW", a gate, a source connected to the drain of transistor 253, and a bulk terminal connected to the bias node. Bandpass network 255 includes a resistor 256, a variable capacitor 257, a variable capacitor 258, and a resistor 259. Resistor 256 has a first terminal connected to the drains of transistors 211 and 212, and a second terminal. Variable capacitor 257 has a first terminal connected to the second terminal of resistor 256, a second terminal connected to the drains of transistors 251 and 252, and a tuning input. Variable capacitor 258 has a first terminal connected to the second terminal of resistor 256, a second terminal connected to the gate of transistor 251, and a tuning input. Resistor 259 has a first terminal connected to the second terminal of variable capacitor 257 and to the drains of transistors 251 and 252, and a second terminal connected to the gate of transistor 251.

In various embodiments, each of one or more optional filtering stages 260 has the same construction besides the exemplary filtering stage 260 shown in FIG. 2. Filter stage 260 includes transistors 261-264 and a bandpass network 265. Transistor 261 is an N-channel MOS transistor having a drain, a gate, and a source connected to ground. Transistor 262 is a P-channel MOS transistor having a source, a gate for receiving control signal NEN, and a drain connected to the drain of transistor 261. Transistor 263 is an N-channel MOS transistor having a drain, a gate, and a source connected to the source of transistor 262, and a bulk terminal connected to ground. Transistor 264 is an N-channel MOS transistor having a drain for receiving power supply voltage VLOW, a gate connected to the bias node, a source connected to the bias node, and a bulk terminal connected to the bias node. Bandpass network 265 includes a resistor 266, a variable capacitor 267, a variable capacitor 268, and a resistor 269. Resistor 266 has a first terminal connected to the drains of transistors 251 and 252, and a second terminal. Variable capacitor 267 has a first terminal connected to the second terminal of resistor 266, a second terminal connected to the drains of transistors 261 and 262, and a tuning input. Variable capacitor 268 has a first terminal connected to the second terminal of resistor 266, a second terminal connected to the gate of transistors 261, and a tuning input. Resistor 269 has a first terminal connected to the second terminal of variable capacitor 267 and to the drains of transistors 261 and 262, and a second terminal connected to the second terminal of capacitor 268 and to the gate of transistor 261.

In operation, LNA 200 achieves triple-stage isolation with a low-voltage bias scheme in order to deliver amplification with a very high PSRR and filtering according to a desired filter characteristic. Filtering and biasing stage 250 includes an amplification element, i.e., transistor 251, in series with three transistors, including a P-channel power off transistor 252 in series with an input leg of a current mirror formed by two N-channel transistors 253 and 254. Transistor 252 disables filtering and biasing stage 250 when control signal NEN_BIAS is inactive at a logic high, and enables filtering and biasing stage 250 when control signal NEN_BIAS is active at a logic low. When enabled, filtering and biasing stage 250 forms the input side of a current mirror by setting the voltage at the bias node.

LNA stage 210 and each filtering stage 260 include an amplification element in series with three transistors, in which two of the three transistors form an output leg of the current mirror, and the third operates as a switch in conduction. In LNA stage 210, transistor 211 forms the amplification element, and its DC bias point is set by resistor 220. Transistors 213 and 214 form an output leg of the current mirror, but LNA stage 210 uses lowpass filters 230 and 240 to filter the bias node to provide a filtered bias voltage to the gates of current source transistors 214 and 215. Since LNA stage 210 is the most noise sensitive stage, lowpass filters 230 and 240 are added to filter the gate voltages of transistors 213 and 214 to increase the PSRR. Forward body biasing is used on transistor 214 by connecting the body electrode to the gate electrode and thereby to set the drain-to-source voltage of transistor 213. By using N-channel MOS transistors for the current source, LNA stage 210 refers the filtering capacitors 232 and 242 to ground, which is the reference of the input signal. In each filtering stage 260, transistor 261 forms the amplification element, and its DC bias point is set by resistor 269. Transistors 263 and 264 form another output leg of the current mirror, but filtering stage 260. Forward body biasing is used on transistor 264 by connecting the body electrode to the gate electrode and thereby to set the drain-to-source voltage of transistor 263.

The bias generation mechanism relies on an N-channel MOS current mirror stacked between the positive power supply voltage and the active LNA circuit, thus providing a very low supply voltage requirement for the active circuit. The bias generation mechanism for this current mirror relies on a current reuse method in which the branch current, which is used to generate the bias voltage, is also utilized for the amplification by embedding the bias generation and LNA stage in the same stack of devices. Therefore, LNA 200 causes near-zero wasted current and increases the power efficiency of LNA 200 while providing superior power supply rejection. The same basic structure is used for a very efficient implementation of a bandpass filter by using second order band-pass filters whose bandpass characteristic can be adjusted by tuning the capacitors.

LNA 200 achieves a very high PSRR, e.g., greater than 80 dB, by using a stack of two NMOS current sources on the output sides of a current mirror of which the input side is formed by corresponding transistors in filtering and biasing stage 250.

LNA 200 also achieves low power because the bias current is drawn from a low-voltage power supply voltage terminal with almost no current wasted and the only current is devoted in an amplification device, i.e., transistor 211. In an exemplary embodiment using modern CMOS transistor technology, VLOW can be set at 0.9V.

Moreover, LNA 200 provides low noise in a single-ended signaling arrangement. It uses a simple amplification element, i.e., N-channel MOS transistor 211 in FIG. 2.

An integrated power-off element, e.g., transistor 212 in LNA stage 210, provides fast startup, such as less than one microsecond (p).

In addition, LNA 200 makes it easy to implement a higher-order filter function with the addition of filtering stages. For example, LNA 200 could implement a second-order bandpass filter by adding a single filtering stage 260. Higher-order bandpass filters can be achieved by adding one or more filtering stages 260.

Figure 3:
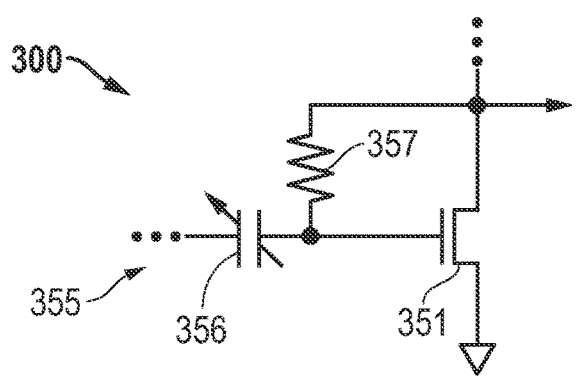
FIG. 3 illustrates in schematic form a portion of a filtering stage of a low noise amplifier including a high pass filter having a high pass characteristic according to various embodiments of the present disclosure.

FIG. 3 illustrates in schematic form a portion of a filtering stage 300 of a low noise amplifier including a high pass filter 355 according to various embodiments of the present disclosure. LNA 300 includes a transistor 351 and high pass filter 355. Transistor 351 is an N-channel MOS transistor having a drain providing an output of filtering stage 300, a gate, and a source connected to ground. High pass filter 355 includes a variable capacitor 356, and a resistor 357. Variable capacitor 356 has a first terminal connected to the output of the previous stage, a second terminal connected to the gate of transistor 351, and a tuning input. Resistor 357 has a first terminal connected to the second terminal of variable capacitor 357 and to the gate of transistors 351, and a second terminal connected to the drain of transistor 351.

When filtering and biasing stage 250 of LNA 200 of FIG. 2 exhibits a high pass characteristic, then transistor 351 can be used in place of transistor 251 and high pass filter 355 can be used in place of bandpass filter 255. Similarly, transistor 351 can be used in place of transistor 261 and high pass filter 355 can be used in place of bandpass filter 265 in each filtering stage 260. Therefore, LNA 300 of FIG. 3 has the same advantages as LNA 200 of FIG. 2 except that it has integral high pass filter characteristics.

The above-disclosed subject matter is to be considered illustrative, and not restrictive, and the appended claims are intended to cover all such modifications, enhancements, and other embodiments that fall within the scope of the claims. For example, an LNA as disclosed herein can include stages having either integral bandpass filter characteristics or integral high pass filter characteristics. The order of the filter can be increased by using additional filtering stages. The low noise amplifier stage can have only one transistor with a corresponding lowpass filter, or more than two.

Thus, to the maximum extent allowed by law, the scope of the present invention is to be determined by the broadest permissible interpretation of the following claims and their equivalents, and shall not be restricted or limited by the forgoing detailed description.

What is claimed is:

1. A low-noise amplifier, comprising:
   a low-noise amplifier stage for receiving an input signal and providing a first output signal in response thereto, said low-noise amplifier stage comprising:
   a gain element for providing said first output signal; and
   at least one lowpass filter circuit in series between a first power supply voltage terminal and said gain element and having a conductivity determined by lowpass filtering a signal at a bias terminal, and
   a filtering and biasing stage having an input for receiving said first output signal, and an output for providing a second output signal, and at least one cascode element having a first current conduction path coupled in series between said bias terminal and said output, and having a predetermined filter characteristic.

2. The low-noise amplifier of claim 1, wherein said predetermined filter characteristic comprises a bandpass characteristic.

3. The low-noise amplifier of claim 2, further comprising:
   at least one bandpass stage having an input for receiving said second output signal, and an output for providing an output of the low-noise amplifier, each of said at least one bandpass stage having a respective cascode element coupled in series between said first power supply voltage terminal and a respective output, and having a bandpass characteristic.

4. The low-noise amplifier of claim 1, wherein said predetermined filter characteristic comprises a high pass characteristic.

5. The low-noise amplifier of claim 1, wherein each of said at least one lowpass filter circuit comprises:
   a transistor having a first current electrode, a control electrode, and a second current electrode, wherein said second current electrode of said transistor of a first one of said at least one lowpass filter circuit is coupled to said output of said gain element, and said first current electrode of said transistor of a last one of said at least one lowpass filter circuit is coupled to said first power supply voltage terminal;
   a resistor having a first terminal coupled to said bias terminal, and a second terminal coupled to said control electrode of said transistor; and
   a capacitor having a first terminal coupled to said control electrode of said transistor, and a second terminal coupled to a second power supply voltage terminal.

6. The low-noise amplifier of claim 1, wherein said low-noise amplifier stage further comprises an enable transistor coupled between said at least one lowpass filter circuit and said output of said gain element.

7. The low-noise amplifier of claim 6, wherein said bias terminal receives a bias current.

8. A low-noise amplifier, comprising:
   a low-noise amplifier stage having a first gain element with an input for receiving an input signal, and an output for providing a first amplified signal, and at least one lowpass filter circuit each having an input coupled to a bias terminal and a first current conduction path coupled between a first power supply voltage terminal and said output of said first gain element;
   a bandpass and biasing stage having a second gain element with an input coupled to said output of said first gain element, and an output for providing a second amplified signal, and at least one cascode element having an input coupled to said bias terminal, and a second current conduction path coupled in series between said bias terminal and said output of said second gain element; and at least one bandpass stage coupled in series, each having a respective gain element with an input coupled to an output of a previous bandpass stage, and an output for providing a corresponding amplified signal, and at least one corresponding cascode element having an input coupled to said bias terminal, and a respective current conduction path coupled in series between said first power supply voltage terminal and said output of a corresponding previous gain element.

9. The low-noise amplifier of claim 8, wherein each of said first gain element, said second gain element, and said respective gain element of said at least one bandpass stage comprises an N-channel metal-oxide-semiconductor (MOS) transistor.

10. The low-noise amplifier of claim 8, wherein each of said at least one lowpass filter circuit comprises:
a transistor having a first current electrode, a control electrode, and a second current electrode, wherein said second current electrode of said transistor of a first one of said at least one lowpass filter circuit is coupled to said output of said first gain element, and said first current electrode of said transistor of a last one of said at least one lowpass filter circuit is coupled to said first power supply voltage terminal;
a resistor having a first terminal coupled to said bias terminal, and a second terminal coupled to said control electrode of said transistor; and
a capacitor having a first terminal coupled to said control electrode of said transistor, and a second terminal coupled to a second power supply voltage terminal.

11. The low-noise amplifier of claim 8, wherein said low-noise amplifier stage comprises a first enable transistor coupled between said at least one lowpass filter circuit and said output of said first gain element.

12. The low-noise amplifier of claim 11, wherein said bandpass and biasing stage comprises a second enable transistor coupled between said at least one cascode element and said output of said second gain element, and each of said at least one bandpass stage comprises a respective enable transistor coupled between said at least one respective cascode element and said output of said respective gain element.

13. The low-noise amplifier of claim 11, wherein said bias terminal receives a bias current.

14. The low-noise amplifier of claim 8, wherein said bandpass and biasing stage further comprises a bandpass network coupled between said input and said output thereof.

15. The low-noise amplifier of claim 14, wherein said bandpass network further comprises:
a first resistor having a first terminal coupled to said output of said first gain element, and a second terminal;

a first capacitor having a first terminal coupled to said second terminal of said first resistor, and a second terminal coupled to said output of said second gain element;
a second capacitor having a first terminal coupled to said second terminal of said first resistor, and a second terminal coupled to said input of said second gain element; and
a second resistor having a first terminal coupled to said output of said second gain element, and a second terminal coupled to said input of said second gain element.

16. A method of amplifying an input signal to provide an output signal with a very high power-supply rejection ratio (PSRR), comprising:
amplifying a radio-frequency (RF) input signal using a first gain element coupled between a first power supply voltage terminal and a second power supply voltage terminal and providing an amplified signal in response to said amplifying;
biasing said first gain element, said biasing comprising modulating a conductivity of at least one cascode transistor, and said biasing further comprising:
generating a bias voltage at a bias terminal using a bias current;
lowpass filtering said bias voltage to form a lowpass filtered bias voltage; and
biasing a control electrode of each of said at least one cascode transistor using said lowpass filtered bias voltage; and
creating said bias voltage in response to said amplified signal.

17. The method of claim 16, wherein creating said bias voltage in response to said amplified signal comprises:
bandpass filtering said amplified signal and forming a bandpass filtered amplified signal in response;
modulating a conductivity of a second gain element in response to said bandpass filtered amplified signal, and generating a second amplified signal in response to said modulating; and
biasing said second gain element using at least one cascode element having a control electrode coupled to said bias terminal, and a second current conduction path coupled in series between said bias terminal and a current conduction path of said second gain element.

18. The method of claim 17, further comprising:
bandpass filtering said second amplified signal in at least one bandpass stage; and
forming the output signal in response to said bandpass filtering.

19. The method of claim 16, wherein:
amplifying said RF input signal using said first gain element comprises amplifying said RF input signal using an N-channel MOS transistor.

20. The method of claim 16, wherein modulating said conductivity of said at least one cascode transistor further comprises modulating a bulk terminal of an N-channel MOS transistor using said lowpass filtered bias voltage.

* * * * *